United States Patent [19]
Beland et al.

[11] Patent Number: 5,408,563
[45] Date of Patent: Apr. 18, 1995

[54] HIGH EFFICIENCY/HIGH VOLTAGE OPTOCOUPLER

[76] Inventors: Robert Beland; Pierre Corbeil, both of c/o Electromed Int'l, 310 Blvd. Industriel, St. Eustache, Canada, J7R 5V3

[21] Appl. No.: 98,200

[22] Filed: Jul. 28, 1993

[51] Int. Cl.6 .............................................. G02B 6/20
[52] U.S. Cl. .................................. 385/125; 385/146; 385/43
[58] Field of Search ................. 385/123, 124, 125, 43, 385/146, 902

[56] References Cited

U.S. PATENT DOCUMENTS

| | | | |
|---|---|---|---|
| 2,569,127 | 7/1946 | Eltenton | 385/125 X |
| 3,825,741 | 7/1974 | Morton et al. | 385/146 X |
| 3,832,028 | 8/1974 | Kapron | 385/43 |
| 3,910,677 | 10/1975 | Becker et al. | 385/43 X |
| 4,946,239 | 8/1990 | Garmon | 385/124 X |
| 5,005,944 | 4/1991 | Laakmann et al. | 385/125 |
| 5,221,387 | 6/1993 | Robbins et al. | 385/125 X |
| 5,271,077 | 12/1993 | Brockman et al. | 385/31 |
| 5,271,079 | 12/1993 | Levinson | 385/43 X |

FOREIGN PATENT DOCUMENTS 1-54405  3/1989  Japan .................................. 385/125

*Primary Examiner*—Rodney B. Bovernick
*Assistant Examiner*—Hemang Sunghavi

[57] ABSTRACT

An optocoupler for isolating a high voltage from a low voltage comprising: an elongated light transmissive rod mounted inside a cavity of a housing, the cavity being filled with a fluid surrounding and in contact with an outside wall surface of the rod; a light emitter mounted at one end of the rod, the light emitter receiving a current input and emitting light in response to the input; a light detector mounted at an opposing end of the rod, the light detector having a detection surface receiving light emitted from the emitter and generating a current output signal in response to the received light; the emitter and detector being mounted such that light emitted from the emitter travels through the rod and is directed toward the detector; a portion of the light emitted from the emitter traveling in a path into impingement with the outside wall surface of the rod; the rod having a first refractive index and the fluid having a second refractive index; the outside wall surface of the rod having a selected contour; the refractive indexes of the rod and the fluid and the contour of the outside wall surface of the rod being selected such that substantially all of the portion of light emitted from the emitter which travels in a path toward impingement with the outside wall surface is reflected one or more times at the wall surface and through the rod toward impingement with the detection surface of the detector.

29 Claims, 6 Drawing Sheets

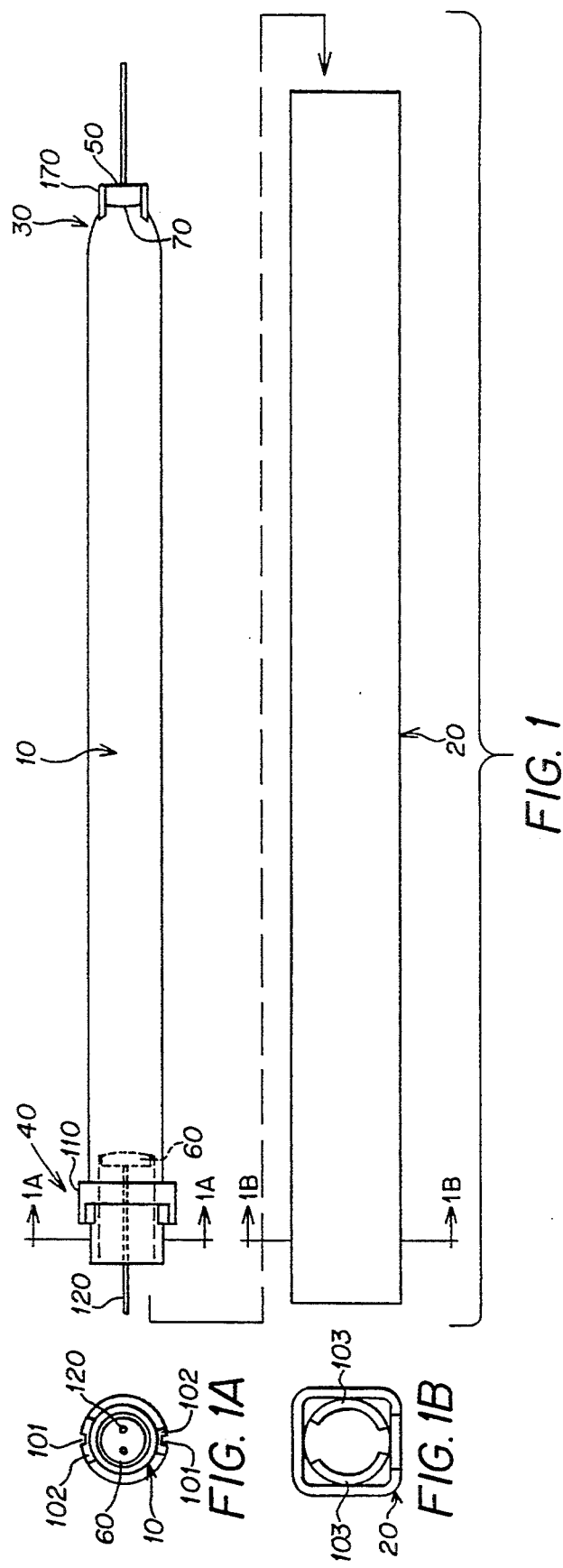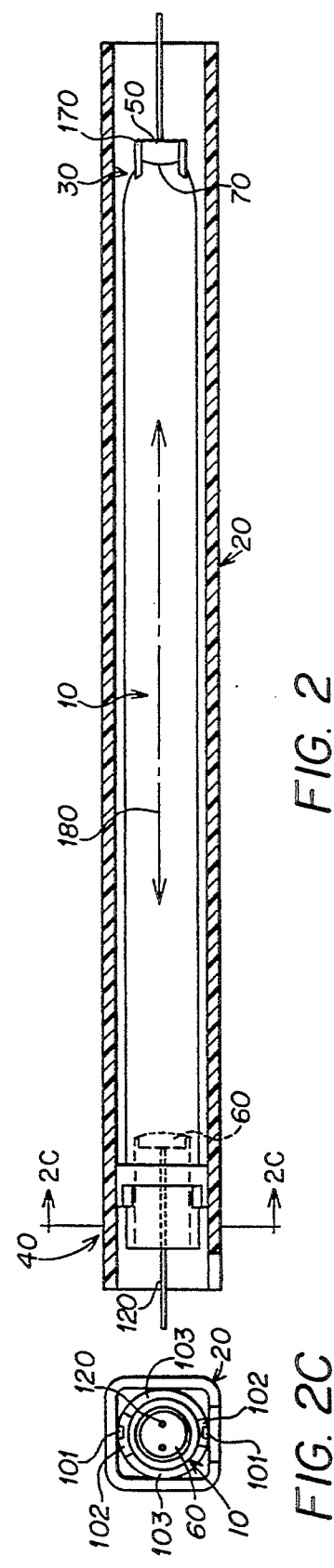

5,408,563

HIGH EFFICIENCY/HIGH VOLTAGE OPTOCOUPLER

BACKGROUND OF THE INVENTION

The present invention relates to optocouplers and more particularly to an optocoupler which can isolate a low voltage section of a circuit from a high voltage section wherein the input current signal is converted linearly to an output current.

Conventional optocouplers typically isolate voltages of only about 10,000 volts or less. In such devices, the light emitting mechanism is closely spaced from the detector with a clear dielectric material provided between the emitter and detector for transmission of light. Because the emitter and detector are closely spaced, loss of light transmission is less of a concern to the efficiency of the transfer. However, where high voltage isolation is concerned, the emitter and detector must be spaced relatively far apart from each other to avoid arcing. Because the emitter and detector are spaced far apart and because the magnitude of the signal generated by the detector is relatively small, e.g. on the order of millamps, it is difficult in conventional mechanisms to achieve a high current transfer ratio (without amplification) due to loss of light transmission and non-linear conversion of the input current to an output current.

Prior attempts to provide high voltage isolation optocouplers have not been able to achieve highly efficient light transmission or high current transfer ratio (ratio of output current to input current) without costly and complex optical transmission design features. In order to reduce cost, conventional high gain photodetectors have been employed which do not necessarily provide a linear detection response and exhibit gain drift with variation in temperature.

SUMMARY OF THE INVENTION

The present invention therefore provides a simple, cost efficient high voltage isolation optocoupler assembly which achieves highly efficient light transmission and provides high current transfer ratio suitable linearity and low drift in detection response.

In accordance with the invention there is provided an optocoupler for isolating a high voltage section of a circuit from a low voltage section having a voltage difference of at least 10,000 volts, the optocoupler comprising: a light pipe mounted inside a housing having a hollow cavity for receiving the light pipe; the light pipe comprising an elongated light transmissive rod extending longitudinally along a selected length between two opposing ends, the rod having a smooth outer wall surface; a light emitter mounted at one end of the rod, the light emitter receiving a current input and emitting light in response to the input; a light detector mounted at the other end of the rod, the light detector having a detection surface receiving light emitted from the emitter and generating an output current signal essentially linearly related to the input signal in response to the received light; the emitter and detector being mounted such that light emitted from the emitter is directed through the rod toward the detector; the emitter emitting light traveling in a path into impingement with the wall surface of the rod; wherein substantially all light emitted from the emitter which impinges on the wall surface is reflected one or more times at the wall surface along a path into impingement with the detection surface of the detector. The minimum ratio of the linearly related output and input currents is at least about 0.9%.

The hollow cavity of the housing contains a selected fluid surrounding and in contact with the outer wall surface of the rod; the rod comprising a material having a first refractive index and the fluid having a second refractive index, the refractive indexes of the rod material and the fluid being selected such that substantially all light emitted from the emitter which travels along a path into impingement with the wall surface of the rod is reflected.

A section of the wall surface of the rod preferably has a parabola-like shape, the parabola-like section having a narrow end at which the emitter is mounted and a wide end spaced a selected distance along the longitudinal length of the rod away from the emitter.

The wall surface of the rod most preferably has a second section beginning at the wide end of the parabola-like section and extending longitudinally to the detector end of the rod, the second section having a conical shape which progressively widens in diameter from the wide diameter end of the first section toward the detector end of the rod.

The refractive index of the rod material is preferably selected to be a maximum value relative to the refractive index of the surrounding fluid material thus minimizing the value of the critical angle. In practice, the rod material must be highly light transmissive and electrically insulating and the fluid material must be electrically insulating. Thus based on the practical availability of suitable materials and the practical design considerations of the rod and its housing, the refractive index $\eta$, of the fluid and the rod material are preferably selected such that the $\sin^{-1}(\eta_{fluid}/\eta_{rod\ material})$ is between about 50 and about 80 degrees.

BRIEF DESCRIPTION OF THE DRAWINGS

Exemplary embodiments of the invention are shown in the accompanying drawings wherein:

FIG. 1 is a side schematic view of an optocoupler according to the invention showing a solid elongated light transmissive rod and the manner in which the rod is to be inserted within a housing;

FIG. 1A is an end view in the direction of lines A—A of FIG. 1;

FIG. 1B is an end view in the direction of lines B—B of FIG. 1;

FIG. 2 is a side schematic cross-sectional view of the assembled FIG. 1 apparatus;

FIG. 2C is an end view in the direction of lines C—C of FIG. 2;

Figure 3:
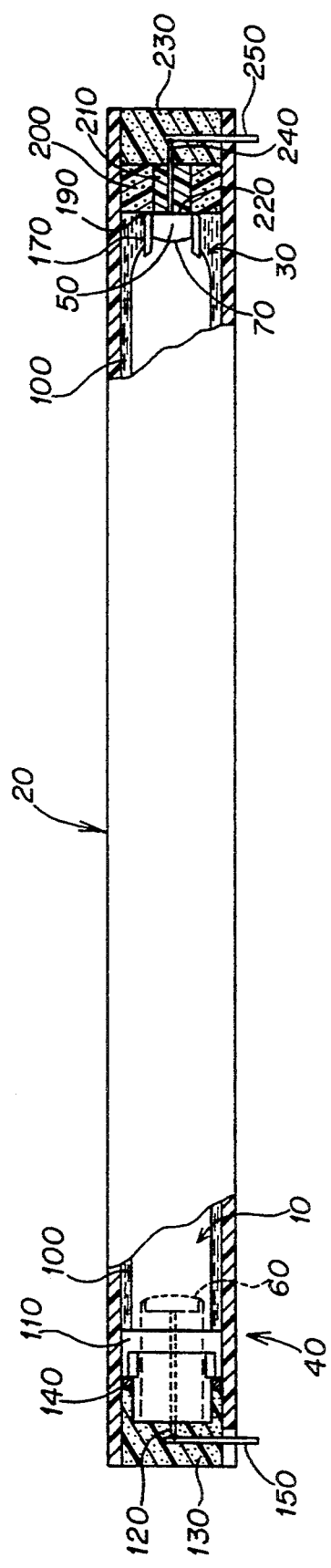
FIG. 3 is a side schematic partial cross-sectional view of the FIGS. 1, 2 apparatus showing further details of mechanisms for mounting the rod and associated light emitter and photodetector components within a housing.

The same references are used throughout the drawings to refer to analogous elements.

DETAILED DESCRIPTION OF PREFERRED EMBODIMENTS

A simplified view of the manner of mounting a light transmissive rod 10 within a housing 20 is shown in FIGS. 1, 2. As shown, the rod 10 has two opposing ends 30, 40 at which a light emitter 50 and a photodetector 60, best shown in FIG. 9, are respectively mounted.

Figure 8:
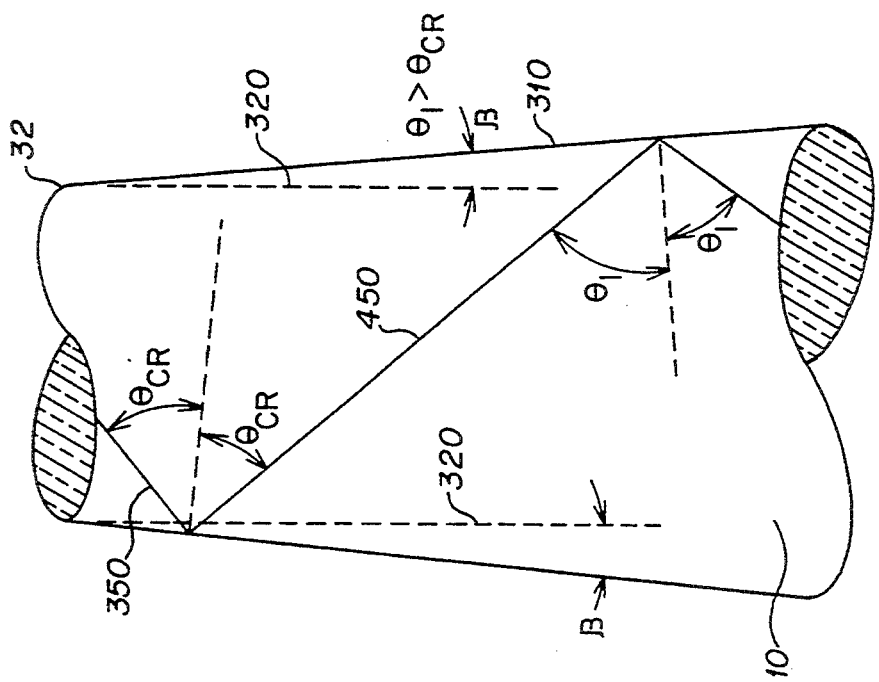
FIG. 8 is a schematic side view of a conically shaped section of a light transmissive rod for use in an optocoupler according to the invention.
Figure 7:
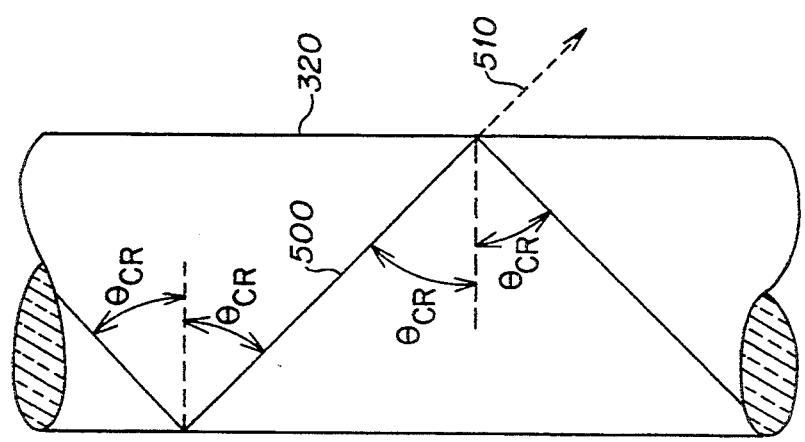
FIG. 7 is a schematic side view of a cylindrically shaped section of a light transmissive rod.
Figure 9:
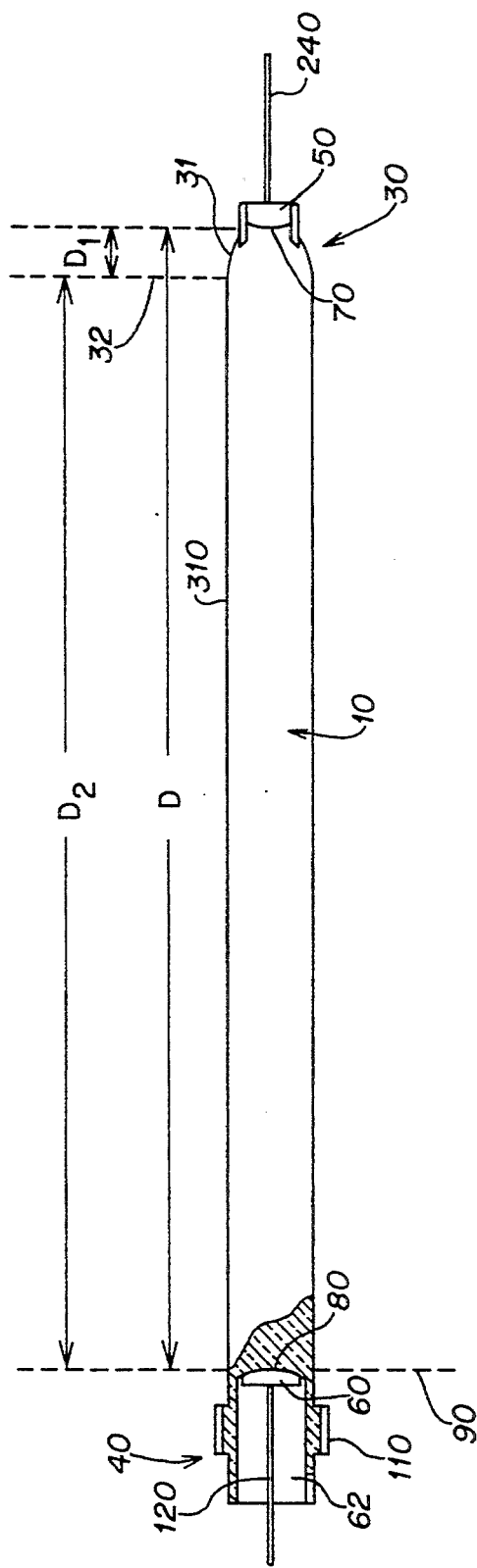
FIG. 9 is a side schematic partial cross-sectional view of the rod of the FIGS. 1, 2, 3 optocoupler showing references according to which various characteristics of an optocoupler according to the invention are preferably designed.

The rod 10 is solid and elongated and extends longitudinally a distance D between a light emitting surface 70 of the emitter and the detection surface 80 of the detector 60, the detection surface 80 shown as lying in a plane perpendicular to axis 180, FIG. 2, designated for reference as 90, FIG. 9, it being understood that, in practice, the surface 80 of a photodetector may not be planar or mountable in a perfect plane, the plane 90 defining a functional planar detection end of the rod 10. The rod 10 is comprised of a highly transmissive material preferably having a light transmissiveness greater than 85% and most preferably greater than about 90%. The rod material is preferably selected such that the rod may be injection molded, thus simplifying the manufacturing process. Exemplary materials out of which the rod may be constructed are synthetic polyacrylics, polycarbonates, polymethylpentenes and styrene acrylonitriles (SAN) which are electrically non-conductive and highly light transmissive as described above. The rod material is further pre-selected on the basis of the value of its refractive index relative to the value of the refractive index of the medium which is selected to be in contact with the outside wall surface 31,310 of the rod 10 as described in detail below with reference to FIGS. 5-9.

As shown in FIG. 3, the two opposing ends 30, 40 of the rod 10 are mounted within the housing 20 such that the outside surface of the rod 10 is spaced from the inside wall surface of the housing 20 leaving a space 100 within the housing which can be filled with a selected non-conductive fluid having a pre-selected refractive index relative to the refractive index of the rod 10 material. End 40 is mounted within housing 20 by a bracket 110 having an outside perimeter surface which fits snugly within the hollow cavity of the housing and which has a complementary central aperture which receives the end 40 of the rod 10 thus mounting the end 40 of the rod 10 such that space 100 is left between the rod 10 and the inner surface of the housing 20.

As best shown in FIG. 9, the detector 60 is mounted at end 40 such that the photodetection surface 80 faces the emitter surface 70. An electrically conductive signal transmitting wire 120 is connected to the photodetector 60 and extends rearwardly of the photodetector 60. The photodetector 60, as best shown in FIG. 9 is inserted within a cavity 62 provided in the detector end 40 of the rod 10. The surface 80 of the detector 60 is typically initially glued onto a complementary surface of the rod at the end of cavity 62 for positioning. The rod 10 is inserted within the cavity of housing 20 as shown in FIGS. 1 and 2. After the assembly of components at emitter end 30, the cavity 100 is filled with the selected fluid, typically by injecting the fluid with a syringe through longitudinal filling holes 101 which are provided in interlocking tabs 102 provided on the outside end surface of rod 10, FIGS. 1A, 2C. Tabs 102 interlock with complementary tabs 103, FIG. 1B, provided on the inside end surface of housing 20. After the fluid is injected through holes 101 into cavity 100, an O-ring 140 is inserted through the detector end of the assembly and sealably engages the end outer surface of the rod 10 and the end inner surface of the housing cavity thus sealing over holes 101 and thus sealing the injected fluid in cavity 100, FIGS. 1-3, 9.

After the O-ring 140 has been sealably inserted, elements 120 and 150 are soldered and the rod cavity 62, FIG. 9, and housing cavity behind the O-ring are filled with a curable resin. Upon curing the resin, the O-ring 140 is secured in place and the cured resin plug further acts as a fluid seal.

An electrically conductive signal transmitting pin 150 is connected to lead wire 120 and extends through plug 130 and the wall of housing 20 outside the housing 20 for ultimate connection and transmission of the signal generated by photodetector 60 to a desired electronic apparatus such as an amplifier, monitor, recorder or the like, FIG. 3.

The opposing emitter end 30, FIGS. 2, 3 of the rod 10 is also mounted such that the outside surface of the emitter end 30 of the rod 10 is spaced from the inside wall surface of the housing 20 leaving the annular fluid filling space 100 to extend longitudinally at least beyond the emitter surface 70 toward the end of the housing cavity. The emitter mechanism 50 is held at the distal tip 160 of the emitter end 30 of the rod 10, FIG. 6, by prongs 170 in axial alignment with the longitudinal axis 180 of the rod 10.

As best shown in FIG. 3, the distal tip ends 190 of the prongs 170 contact the forward surface of a spacer ring 200 which is comprised of a resiliently compressible material such as a closed cell material. The spacer 200 is inserted within the hollow cavity of the housing 20 and seated against the tip ends 190 of the prongs 170 as shown in FIG. 3. A solid spacer 210 is seated against the rearwardly facing surface 220 of the housing of the emitter 50 and a curable cast plug 230, comprising e.g. a curable resin material, is injected into the hollow emitter end of the housing cavity such that the plug 230 abuts the rearward facing surface of the solid spacer 210. As shown in FIG. 3, the combination of the plug 230, solid spacer 210, emitter 50 housing, plug 130 and detector 60 housing and their respective mounting arrangements thus hold the rod 10 longitudinally stationary within the cavity of the housing 20, FIG. 3.

Figure 6:
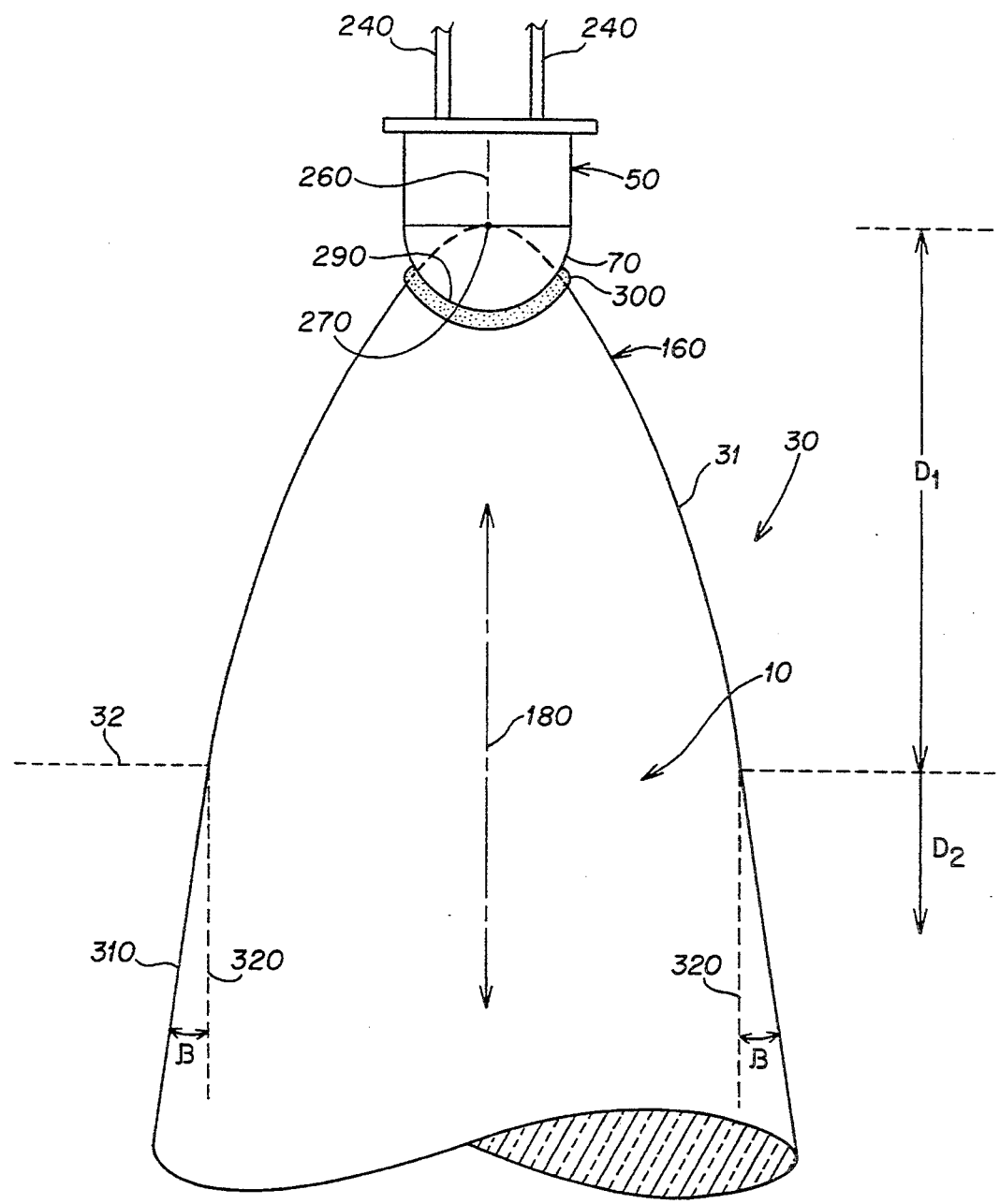
FIG. 6 is a schematic side cross-sectional view of the light emitter end of the rod of the FIG. 1 optocoupler showing exemplary details of a mounting arrangement for a light emitter at the parabola-like shaped end of the rod and showing a continuum from a substantially parabolic to a slightly conical shape on the outside surface of a preferred rod for use in the FIG. 1 optocoupler according to the invention.

The emitter 50 includes a conductive signal transmitting wire or wires 240, FIGS. 3, 6 extending rearwardly from the emitter 50 through spacer 210 and into the plug 230. The wires 240 are connected at one end to the emitter 50 and connected at another end to conductive pins 250 which extends through the wall of the housing 20 outside the housing 20 for connection to the source of current input to the emitter 50. As can be readily imagined, the longitudinal axis 180 of the rod 10 is maintained in general coaxial alignment with the longitudinal axis of the housing at the emitter end of the housing 20 by the prongs 170 holding the emitter 50 housing, the spacer ring 200 (which engages the inside surface of the housing cavity), the solid spacer 210 which is disposed within an axially central aperture in the spacer ring 200 and the wires 240 which extends generally through the center of the solid spacer 240 and into the plug 230.

The plug 230 seals the emitter end of the housing cavity such that the selected fluid which is ultimately injected into and fills the space 100 is sealed within the space 100. The resiliently compressible spacer ring 200 which occupies some amount of the sealed space 100 is provided for allowing the fluid which is injected into the sealed space 100 to expand upon temperature elevation without exerting undue fluid pressure within the cavity 100 when sealed. That is, if the fluid expands upon the occurrence of temperature elevation for any reason, the spacer 200 will compress. Upon cooling of the fluid the spacer 200 will resiliently expand such that the sealed space 100 always remains completely filled and the selected fluid always surrounds and remains in contact with the entirety of the outside surface 31,310 of the rod 10 extending longitudinally 180 at least between the emitter surface 70 and the detector surface 80, 90, FIG. 9.

Figure 5:
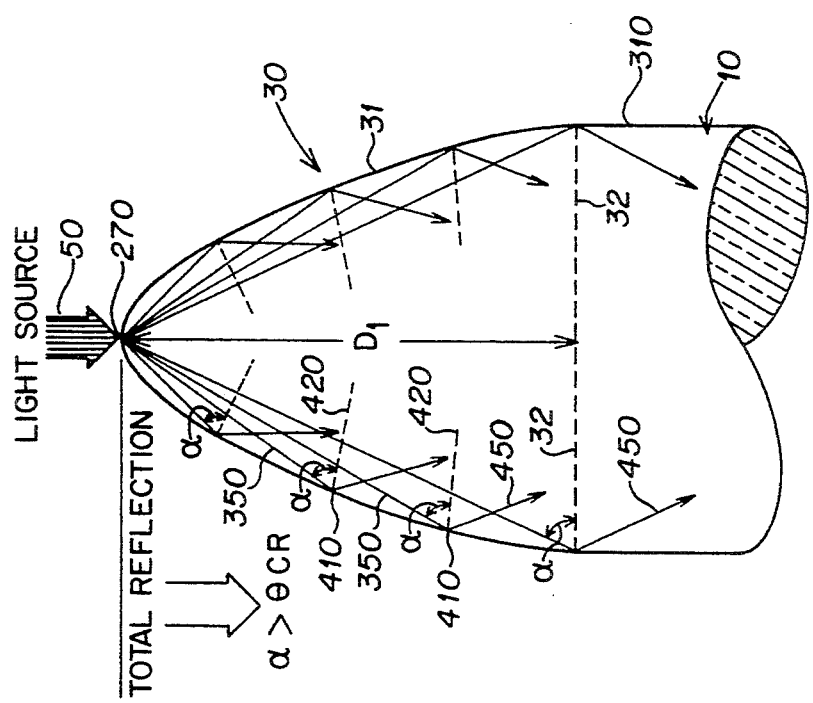
FIG. 5 is a side cross-sectional schematic view of a substantially parabolic shaped end of a light transmissive rod at which a light emitter is mounted in a FIG. 1 optocoupler according to the invention.

As shown best in FIGS. 5, 6 the outer surface 31 of the end 30 of the rod 10 at which the emitter 50 is mounted has a parabola-like or substantially parabolic contour and shape. In radial cross-section the rod is preferably circular along its entire longitudinal length between the emitter surface 70 and detector surface 80.

As shown in FIG. 6, a typical emitter mechanism 50, such as a light emitting diode (LED), has a curved lens or light emitting surface 70. The light emitting source 270 and the axis 260 of the emitter 50 are held or mounted generally coaxially with the longitudinal axis 180 of the rod 10, FIG. 6. The tip end 160 of the substantially parabolic end 30 of the rod 10 is provided with a groove 290 which is complementary in shape with and receives the curved contour of the emitter surface 70 as shown in FIG. 6. The groove 290 is cut to a depth within the tip end 160 of the rod 10 such that when the emitter surface 70 is received within the groove 290, the axially central point 270 of the light emitting source preferably coincides with the narrowest distal end point 270 of the parabolic tip end 30 of the rod 10, FIG. 6. In practice, a layer of clear, light transmissive adhesive material 300 is typically disposed between the emitter surface 70 and the complementary surface of the groove 290 which receives the emitter surface 70 thereby further serving to stationarily mount the emitter 50 at the tip of the rod end 160.

As shown in FIGS. 6, 9 the substantially parabolic shaped outer surface 31 of end 30 extends a longitudinal distance $D_1$ along the length of the rod 10 beginning at the emitter source 270. At the widest diameter end 32 of the parabolic shaped section 31, the rod 10 continues to extend a longitudinal distance $D_2$, FIG. 6 toward the detector 60 at least to or past the plane 90 of the detector surface 80, FIG. 9.

The outer surface 310, FIGS. 6, 9, of the portion of the rod 10 which extends from the widest end 32 of the parabolic surface 31 section to at least the detector surface 80, FIG. 9, is preferably slightly conical in shape or contour, varying typically between about $\frac{1}{4}$ and $\frac{1}{2}$ degrees in an angle $\beta$ of deviation from an otherwise perfectly cylindrical configuration shown by the phantom lines 320. Most preferably, the angle $\beta$ of deviation from cylindrical 320 of the outer conically contoured surface 310 ranges between about $\frac{1}{3}$ and about 5/12 degrees.

Figure 4:
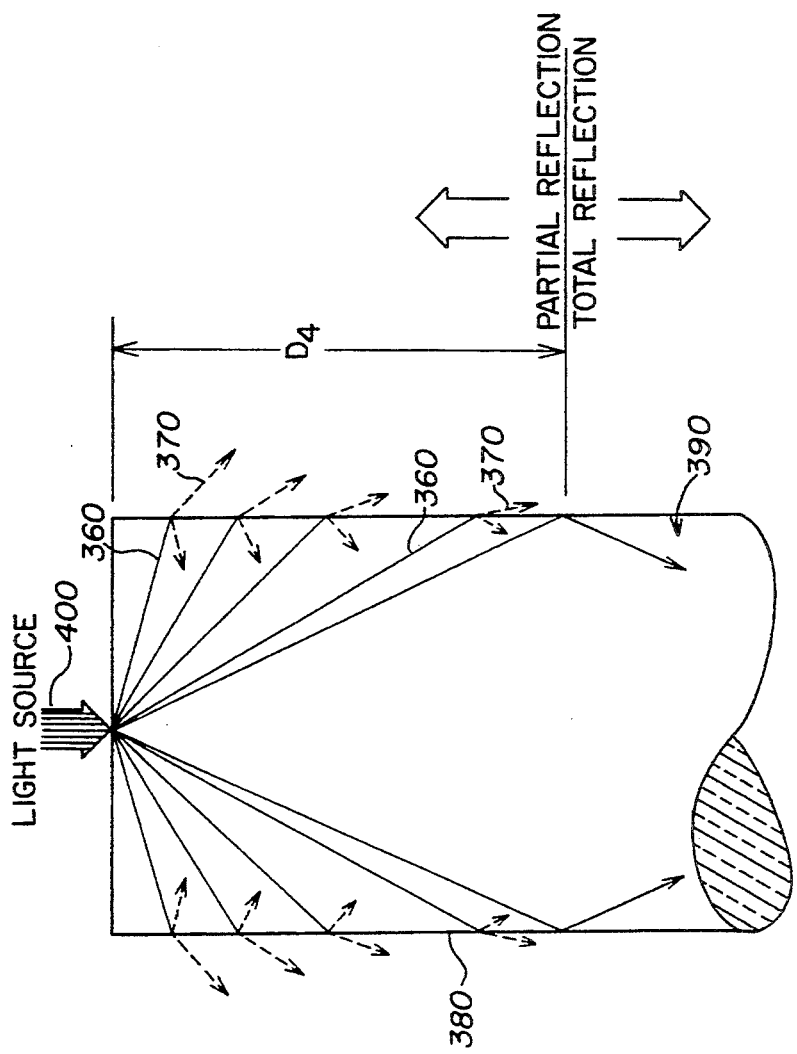
FIG. 4 is a side cross-sectional schematic of a prior art mechanism for mounting alight emitter at the end of a light transmissive rod.

The parabolic shaped surface 31 of end 30 serves to ensure that substantially all light rays 350 which emanate from the emitter 50 and travel along a path into impingement with the surface 31 are reflected back into and through the rod 10, FIG. 5, rather than, as in prior light pipes, FIG. 4, allowing light rays 360 partially to escape 370 from the conventionally cylindrically shaped surface 380 at the end of the rod 390 at which a light source 400 is mounted.

The specific length $D_2$, FIG. 9, and the contour of the substantially parabolic shaped surface 31 is selected according to the pre-selected refractive indexes, $\eta$, of the rod 10 material and the fluid which fills the sealed space 100. The angle at which a light ray strikes the outside rod surface and the refractive indexes of the rod and surrounding medium dictate whether the light ray essentially will be reflected completely back into the rod medium through which it is traveling or whether it will travel partly through the rod surface into the surrounding medium.

As shown in FIG. 5, if the angle $\alpha$, which is the angle between the light ray 350 and a line perpendicular 420 to the plane tangent to the surface 31 at the point 410 of ray 350 contact with the surface, is greater than the critical angle $\theta$, the ray 350 will reflect 450 back into the rod 10. The critical angle $\theta$ is defined by Snell's law $\theta_{cr} = \sin^{-1}(\eta_{fluid}/\eta_{rod})$. Thus, by providing the end 30 of the rod 10 with a parabola-like contour 31, the angle $\alpha$ at which light rays 350 strike the surface 31 can be substantially ensured of being greater than $\theta_{cr}$, unlike prior mechanisms 390, FIG. 4, which make it difficult to select suitable rod materials and surrounding media materials having refractive indexes which will substantially ensure against partial transmission loss 370 of rays 360 through a cylindrical surface 380 along the length $D_4$ from the light source 400. In prior mechanisms such as shown in FIG. 4, the partial loss of unreflected light 370 is greater than 15% of the total amount of light emitted by the light source 400 and is often as much as 25% or more which substantially decreases the current transfer ratio. Such losses of partially transmitted or unreflected light 370 are substantially or essentially completely eliminated by the present invention, i.e. to less than 15% of the total amount of light which impinges on the rod surface and typically to less than about 5%. Along the length $D_1$ alone, FIGS. 5, 6, such losses of partially transmitted light are less than about 5% and preferably less than 2% of the total amount of light 350, FIG. 5, which impinges on the rod surface along length $D_1$.

As shown in FIGS. 6, 8, the section of the rod 10 extending longitudinally from the wide end 32 of the parabola-like section 30 toward the detector end 40 of the rod 10, FIGS. 1-3, 9, has a slightly conical shape as described above. The slightly conically shaped surface 310 also better ensures that a light ray 450, FIGS. 5, 8 which reflects off the parabola-like surface 31 (or otherwise traveling from the emitter 50) will subsequently strike surface 310 at a subsequent angle $\theta_1$ which is greater than $\theta_{cr}$. Because there are inevitably surface irregularities at the surface of any rod material, even when polished, if a light ray 500, FIG. 7, impinges at the rod surface at an angle close to $\theta_{cr}$, surface irregularities may result in unwanted transmission 510 of an impinging light ray 500 through the rod surface 320. Thus, the slightly conical shape of the rod surface 310 better insures that $\theta_1$ will be greater than $\theta_{cr}$ and therefore that substantially all reflected light rays 450 and other light rays originating from the emitter 50 and impinging on surface 310 will ultimately be reflected one or more times through the rod 10 and toward impingement with detector surface 80.

There is no lower limit to the critical angle, although as a practical matter the selection of available rod and fluid materials typically limits the critical angle to a lower limit of about 50 degrees. The upper limit to the critical angle is determined by the rod size. The higher the critical angle, the longer the input length $D_1$ must be. The theoretical limit is where the length $D_1$ equals D, the length of the rod. Thus, for any given critical angle which is determined by the preselected refractive indices of the rod and fluid materials, the longitudinal length $D_1$ of the parabolic section of the rod and the diameter of the rod, d, in the photodetection plane 90 is determined according to the formula:

$$\theta_{cr} = \tan^{-1}[2D/d]$$

In practice, the rod material and the surrounding fluid are preferably selected to have refractive indexes $\eta_{rod}$ and $\eta_{fluid}$ such that $\theta_{cr}$ is less than about 80 degrees and typically less than about 65 degrees.

The use in combination of a polyacrylic rod material having a refractive index of between about 1.48 and about 1.50 and a perfluorocarbon fluid having a refractive index of between about 1.23 and about 1.30 have been found particularly useful because such materials also have favorable dielectric strengths greater than about 400 v/mil. which can isolate a high voltage difference of at least 10 Kv between the emitter end and detector end circuitry. The refractive index of the fluid is always less than the refractive index of the rod material. The length D between the detector 60 and the emitter is selected such that D has a minimum length about equal in centimeters (cm) to the voltage difference (in kilovolts) between the emitter end and the detector end divided by 5 kilovolts where the rod 10, fluid and housing 20 materials are essentially non-conductive, i.e., having a dielectric strength of at least about 400 v/mil.

Preferably, an optocoupler according to the invention can isolate a high voltage of at least about 50 Kv and most preferably at least about 80 Kv.

The detector mechanism 60 is preferably a photodiode which provides good linearity and low drift. The emitter mechanism 50 is preferably an LED. Other light emitting mechanisms which emit light in response to receipt of a current input and other photodetectors which emit a predictable output signal in response to receipt of light can also be employed. Preferably, the detector 60 is selected to have a non-linearity of at most 2%.

The rod material selected preferably has light transmissiveness of at least about 90%.

It will now be apparent to those skilled in the art that other embodiments, improvements, details and uses can be made consistent with the letter and spirit of the foregoing disclosure and within the scope of this patent, which is limited only by the following claims, construed in accordance with the patent law, including the doctrine of equivalents.

What is claimed is:

1. An optocoupler for isolating a high voltage from a low voltage having a voltage difference of at least 10,000 volts, the optocoupler comprising:

a light pipe mounted inside a housing having a hollow cavity for receiving the light pipe;

the light pipe comprising an elongated light transmissive rod extending longitudinally along a selected length between two opposing ends, the rod having a smooth outer wall surface; a light emitter mounted at one end of the rod, the light emitter receiving a current input and emitting light in response to the input; a light detector mounted at the other end of the rod, the light detector having a detection surface receiving light emitted from the emitter and generating a current output signal in response to the received light;

the emitter and detector being mounted such that light emitted from the emitter is directed through the rod toward the detector;

the emitter emitting light traveling in a path into impingement with the wall surface of the rod;

said light pipe isolates said high voltage from said low voltage having said voltage difference of at least 10,000 volts;

wherein substantially all light emitted from the emitter which impinges on the wall surface is reflected one or more times at the wall surface along a path into impingement with the detection surface of the detector.

2. The optocoupler of claim 1 wherein the hollow cavity of the housing contains a selected fluid surrounding and in contact with the outer wall surface of the rod;

the rod comprising a material having a first refractive index and the fluid having a second refractive index, the refractive indexes of the rod material and the fluid being selected such that substantially all light emitted from the emitter which travels along a path into impingement with the wall surface of the rod is reflected.

3. The optocoupler of claim 1 wherein the outer wall surface of the rod has a contour selected to reflect substantially all light emitted from the emitter which impinges on the outer wall surface.

4. The optocoupler of claim 1 wherein the contour of the wall surface of the rod is selected such that less than 15% of all light which emanates from the emitter and impinges on the wall surface of the rod transmits through the surface.

5. The optocoupler of claim 1 wherein the contour of the wall surface of the rod is selected such that less than 5% of all light which emanates from the emitter and impinges on the wall surface of the rod transmits through the surface.

6. The optocoupler of claim 3 wherein a section of the wall surface of the rod has a substantially parabolic shape, the parabola-like section having a narrow end at which the emitter is mounted and a wide end spaced a selected distance along the longitudinal length of the rod away from the emitter.

7. The optocoupler of claim 6 wherein the wall surface of the rod has a second section beginning at the wide end of the substantially parabolic section and extending longitudinally to the detector end of the rod, the second section having a conical shape which progressively widens in diameter from the wide diameter end of the first section toward the detector end of the rod.

8. The optocoupler of claim 3 wherein the hollow cavity of the housing contains a selected fluid surrounding and in contact with the outer wall surface of the rod;

the rod comprising a material having a first refractive index and the fluid having a second refractive index, the refractive indexes of the rod material and the fluid being selected such that substantially all light emitted from the emitter which travels along a path into impingement with the wall surface of the rod is reflected.

9. The optocoupler of claim 6 wherein the hollow cavity of the housing contains a selected fluid surrounding and in contact with the outer wall surface of the rod;

the rod comprising a material having a first refractive index and the fluid having a second refractive index, the refractive indexes of the rod material and the fluid being selected such that substantially all light emitted from the emitter which travels along a path into impingement with the wall surface of the rod is reflected.

10. The optocoupler of claim 7 wherein the hollow cavity of the housing contains a selected fluid surrounding and in contact with the outer wall surface of the rod;

the rod comprising a material having a first refractive index and the fluid having a second refractive index, the refractive indexes of the rod material and the fluid material being selected such that substantially all light emitted from the emitter which travels along a path into impingement with the wall surface of the rod is reflected.

11. The optocoupler of claim 2 wherein the refractive index $\eta$, of the fluid and the rod material are selected such the $\sin^{-1}$ ($\eta_{fluid}/\eta_{rod\ material}$) is between about 50 and about 80 degrees.

12. The optocoupler of claim 8 wherein the refractive index $\eta$, of the fluid and the rod material are selected such the $\sin^{-1}$ ($\eta_{fluid}/\eta_{rod\ material}$) is between about 50 and about 80 degrees.

13. The optocoupler of claim 3 wherein at least a section of the wall surface of the rod extending a selected length between the ends of the rod has a conical shape progressively widening in diameter along the length of the section as the section approaches the detector end of the rod.

14. The optocoupler of claim 13 wherein the hollow cavity of the housing contains a selected fluid surrounding and in contact with the outer wall surface of the rod;

the rod comprising a material having a first refractive index and the fluid having a second refractive index, the refractive indexes of the rod material and the fluid being selected such that substantially all light emitted from the emitter which travels along a path into impingement with the wall surface of the rod is reflected.

15. The optocoupler of claim 14 wherein the refractive index $\eta$, of the fluid and the rod material are selected such the $\sin^{-1}$ ($\eta_{fluid}/\eta_{rod\ material}$) is between about 50 and about 80 degrees.

16. The optocoupler of claim 2 wherein the rod material and the fluid are electrically non-conductive having a dielectric strength of at least about 400 v/mil.

17. The optocoupler of claim 2 wherein the rod material is an injection moldable material having a light transmissiveness of at least 85%.

18. The optocoupler of claim 17 wherein the rod material consists essentially of an acrylic material.

19. The optocoupler of claim 16 wherein the fluid consists essentially of a perfluorocarbon material.

20. The optocoupler of claim 16 wherein the rod material is an injection moldable material having a light transmissiveness of at least 85%.

21. The optocoupler of claim 20 wherein the rod material consists essentially of an acrylic material.

22. The optocoupler of claim 19 wherein the rod material is an injection moldable material having a light transmissiveness of at least 85%.

23. The optocoupler of claim 22 wherein the rod material consists essentially of an acrylic material.

24. An optocoupler for isolating a high voltage from a low voltage comprising:

an elongated light transmissive rod mounted inside a cavity of a housing, the cavity being filled with a fluid surrounding and in contact with an outside wall surface of the rod;

said light transmissive rod isolates a high voltage from a low voltage having a voltage difference of at least 10,000 volts;

a light emitter mounted at one end of the rod, the light emitter receiving a current input and emitting light in response to the input;

a light detector mounted at an opposing end of the rod, the light detector having a detection surface receiving light emitted from the emitter and generating a current output signal in response to the received light; the emitter and detector being mounted such that light emitted from the emitter travels through the rod and is directed toward the detector;

a portion of the light emitted from the emitter traveling in a path into impingement with the outside wall surface of the rod;

the rod having a first refractive index and the fluid having a second lower refractive index;

the outside wall surface of the rod having a selected contour;

the refractive indexes of the rob and the fluid and the contour of the outside wall surface of the rod being selected such that substantially all of the portion of light emitted from the emitter which travels in a path toward impingement with the outside wall surface is reflected one or more times at the wall surface and through the rod toward impingement with the detection surface of the detector.

25. The optocoupler of claim 24 wherein the rod has a selected longitudinal length extending between the emitter and the detection surface, and wherein a section of the wall surface of the rod has a substantially parabolic shape, the parabola-like section having a narrow end at which the emitter is mounted and a wide diameter end spaced a selected distance along the longitudinal length of the rod away from the emitter.

26. The optocoupler of claim 25 the wall surface of the rod has a second section beginning at the wide diameter end of the substantially parabolic section and extending longitudinally to the detector end of the rod, the second section having a conical shape which progressively widens in diameter from the wide diameter end of the first section toward the detector end of the rod.

27. The optocoupler of claim 24 wherein the rod and the fluid are nonductive, the emitter and the detector being spaced apart at the opposing ends a minimum distance in centimeters of $(Kv_{emitter} - Kv_{detector})/5$ Kv, wherein $K_v$ emitter is the kilovoltage at the emitter and $K_v$ detector is the kilovoltage at the detector end.

28. The optocoupler of claim 25 wherein the wide diameter end of the substantially parabolic section is spaced a distance, $D_1$, away from the emitter according to the formula $\sin^{-1}$ (second refractive index/first refractive index) $= \tan^{-1}(D_1/d)$ wherein d is the diameter of the rod in a plane coincident with a point on a detection surface of the detector.

29. The optocoupler of claim 24 wherein the refractive indexes of the rod and the fluid and the contour of the wall surface of the rod are selected such that less than 5% of all light which emanates from the emitter and impinges on the wall surface transmits through the wall surface.

* * * * *